(12) United States Patent
Uno et al.

(10) Patent No.: US 8,617,773 B2
(45) Date of Patent: Dec. 31, 2013

(54) METHOD OF CORRECTING MASK PATTERN, COMPUTER PROGRAM PRODUCT, AND METHOD OF MANUFACTURING SEMICONDUCTOR DEVICE

(75) Inventors: Taiga Uno, Kanagawa (JP); Toshiya Kotani, Tokyo (JP); Hiromitsu Mashita, Kanagawa (JP); Yukiyasu Arisawa, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/239,019

(22) Filed: Sep. 21, 2011

(65) Prior Publication Data

US 2012/0244707 A1    Sep. 27, 2012

(30) Foreign Application Priority Data

Mar. 22, 2011 (JP) .................. 2011-062841

(51) Int. Cl.
*G03F 1/44* (2012.01)
*G03F 1/72* (2012.01)
*G03F 1/38* (2012.01)

(52) U.S. Cl.
USPC ............................................. 430/5

(58) Field of Classification Search
USPC ................ 430/5, 30; 716/51; 438/694
See application file for complete search history.

(56) References Cited

U.S. PATENT DOCUMENTS

| 6,243,855 | B1 | 6/2001 | Kobayashi et al. |
| 6,625,802 | B2 | 9/2003 | Singh et al. |
| 6,898,781 | B2 | 5/2005 | Singh et al. |
| 7,199,863 | B2 * | 4/2007 | Bruls et al. ................ 355/69 |
| 7,234,130 | B2 | 6/2007 | Word et al. |
| 7,601,471 | B2 | 10/2009 | Osawa et al. |

FOREIGN PATENT DOCUMENTS

| JP | 11-168065 | 6/1999 |
| JP | 2007-524255 | 8/2007 |
| JP | 2008-288338 | 11/2008 |
| JP | 2009-170839 | 7/2009 |
| JP | 2010-192634 | 9/2010 |
| JP | 2010-206199 | 9/2010 |
| WO | WO 2005/082063 A2 | 9/2005 |

OTHER PUBLICATIONS

Notice of Rejection issued by the Japanese Patent Office on Jun. 11, 2013, for Japanese Patent Application No. 2011-062841, and English-language translation thereof.

* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

In the method of correcting a mask pattern according to the embodiments, a mask pattern correction amount for a reference flare value is calculated as a reference mask correction amount, for every type of patterns within the layout, and a change amount of the mask pattern correction amount corresponding to the change amount of the flare value is calculated as the change amount information. A mask pattern corresponding to the flare value of the pattern is created based on the reference mask correction amount and the change amount information corresponding to the pattern, extracted from the information having the pattern, the reference mask correction amount, and the change amount information correlated with each other, and based on a difference between the flare value of the pattern and the reference flare value.

14 Claims, 13 Drawing Sheets

FIG.3

| NEW PATTERN | REFERENCE CORRECTION AMOUNT | FLARE CORRECTION SENSIBILITY |
|---|---|---|
| | | FLARE CORRECTION AMOUNT vs FLARE VALUE |
| | | FLARE CORRECTION AMOUNT vs FLARE VALUE |
| ⋮ | ⋮ | ⋮ |

| | LOW FLARE (POSITION P1) | MEDIUM FLARE (POSITION P2) | HIGH FLARE (POSITION P3) |
|---|---|---|---|
| NOT CORRECTED PATTERN | 61 | 61 | 61 |
| OPTICAL IMAGE | 62A | 62B | 62C |
| CORRECTED PATTERN | 63A | 63B | 63C |

FIG.11A

| PATTERN WIDTH | PATTERN SPACE | FLARE CORRECTION SENSIBILITY |
|---|---|---|
| 28 nm | <=30 nm | -1.8 nm/% |
| | <=32 nm | -1.8 nm/% |
| | >32 nm | -1.5 nm/% |
| 30 nm | <=30 nm | -1.7 nm/% |
| | <=32 nm | -1.8 nm/% |
| | >32 nm | -1.4 nm/% |
| 32 nm | <=32 nm | -1.6 nm/% |
| | >32 nm | -1.2 nm/% |
| ⋮ | ⋮ | ⋮ |

FIG.11B

| PATTERN WIDTH | PATTERN SPACE | FLARE VALUE | FLARE CORRECTION AMOUNT |
|---|---|---|---|
| 28 nm | <=28 nm | 3% | -1 nm |
| | | 4% | -1.2 nm |
| | | 5% | -1.4 nm |
| | <=32 nm | 3% | -1.2 nm |
| | | 4% | -1.4 nm |
| | | 5% | -1.6 nm |
| | >32 nm | 3% | -1.4 nm |
| | | 4% | -1.6 nm |
| | | 5% | -1.8 nm |
| 30 nm | <=30nm | 3% | -1.1 nm |
| ⋮ | ⋮ | ⋮ | ⋮ |

METHOD OF CORRECTING MASK PATTERN, COMPUTER PROGRAM PRODUCT, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2011-062841, filed on Mar. 22, 2011; the entire contents of which are incorporated herein by reference.

FIELD

Embodiments described herein relate generally to a method of correcting a mask pattern, a computer program product, a mask pattern correcting apparatus, and a method of manufacturing a semiconductor device.

BACKGROUND

With the progress in miniaturization of patterns in these days, EUV (Extreme Ultra Violet) having a shorter wavelength than that of ArF has been used in a lithography for use in manufacturing semiconductor devices (semiconductor integrated circuits). By shortening the wavelength of lithography light, resolution of a pattern transferred by the lithography is improved and a finer pattern can be formed; while, according as the wavelength gets shorter, the system structure and the exposure method have been changing from the conventional exposure method. A projection optical system has been drastically changed. The conventional projection optical system has used an inflection lens; in the EUV exposure, however, EUV does not pass through the inflection lens due to a relation with optical absorption and refractive index. Therefore, in the EUV lithography, the conventional inflection lens cannot be used but a reflection optical system such as a mirror has to be used.

In manufacturing a mirror, its surface has to be polished; however, it is difficult to polish it completely flat but roughness remains on the mirror surface. At a pattern exposure, this roughness irregularly reflects the lithography light emitted on the mirror surface and the scattered light falls on a not-intended region on the resist surface of a wafer. Therefore, contrast is deteriorated on the wafer and the pattern image becomes blurred, thereby causing a problem that the finished dimension (finished pattern shape) is not a desired one.

The exposure light irregularly reflected on the mirror surface is called flare, which is one of a big factor causing degradation in forming an accurate pattern using the EUV. Because the amount of flare is affected by the scattered light nearby, it varies depending on the pattern density (brightness) in the surrounding. Therefore, a problem arises that the finished dimension is different depending on a position (pattern arrangement position) even in the same mask pattern. There is needed a technology for performing a mask pattern correction with flare taken into consideration, at high speed and at high accuracy.

BRIEF DESCRIPTION OF THE DRAWINGS

FIG. 3 is a view illustrating a structure example of a table;

FIGS. 11A and 11B are rule information of a flare correction on a pattern width and a pattern space;

DETAILED DESCRIPTION

According to preferred embodiments, a method of correcting a mask pattern is proposed. In this mask pattern correcting method, a correction amount for a reference flare value is calculated, through simulation of a wafer transfer, as a reference mask correction amount, in each type of pattern positions within a layout targeted for correction and a change amount of a mask correction amount corresponding to a change of a flare value is calculated as change amount information. The pattern, the reference mask correction amount, and the change amount information are correlated with each other as correspondence information.

Then, when correcting a pattern, the reference mask correction amount and the change amount information corresponding to the pattern are extracted from the correspondence information. A difference correction amount corresponding to a change of the flare is calculated, based on a flare difference that is a difference between a flare value at an arrangement position of the pattern and the reference flare value. Then, a mask pattern corresponding to the flare value of the pattern is created using the difference correction amount and the reference mask correction amount.

A method of correcting a mask pattern, a computer program product, a mask pattern correcting apparatus, and a method of manufacturing a semiconductor device according to preferred embodiments will be described in detail with reference to the accompanying drawings. The invention is not restricted to these embodiments.

(First Embodiment)

Figure 1:
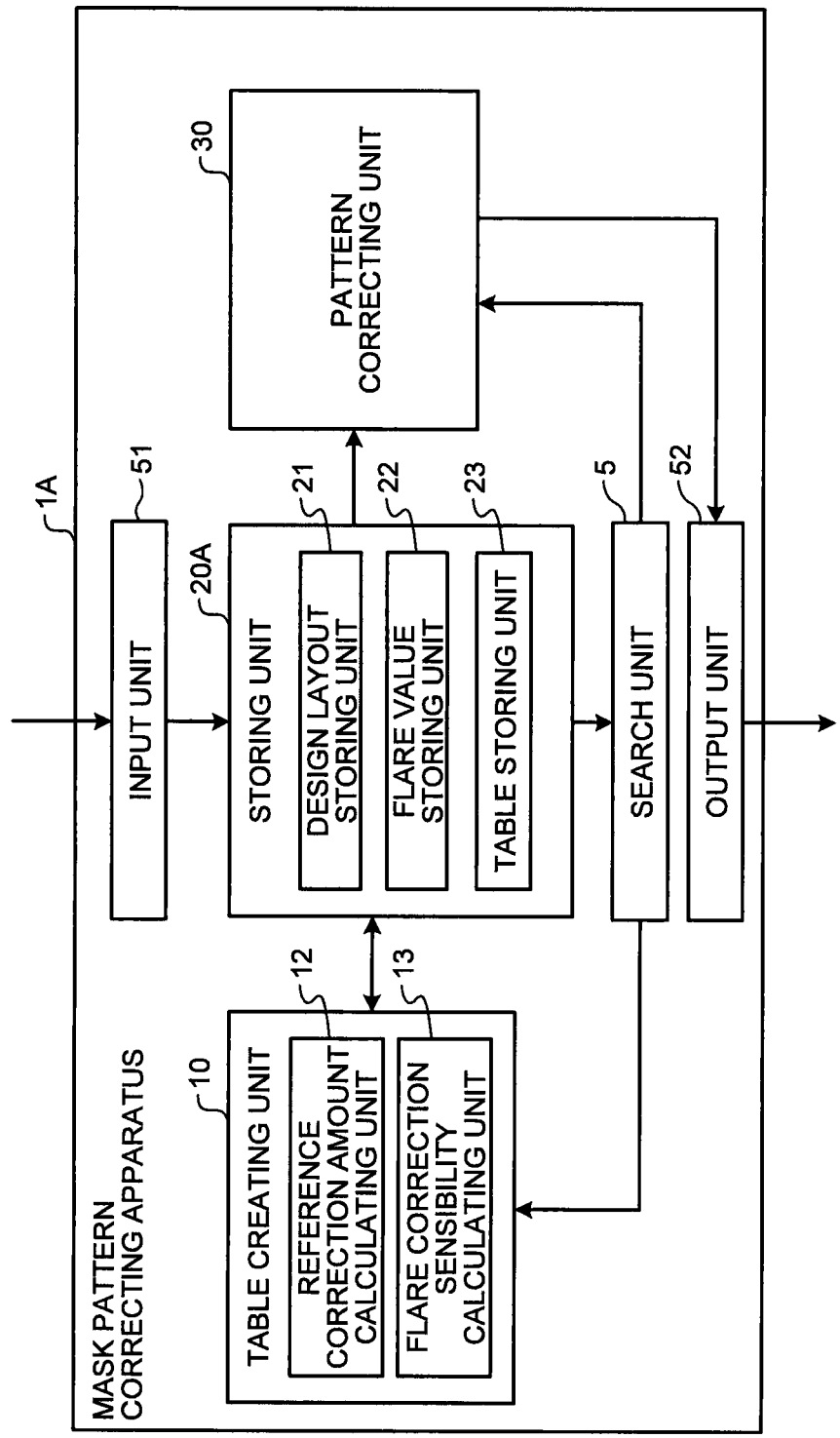
FIG. 1 is a block diagram illustrating a structure of a mask pattern correcting apparatus according to a first embodiment.

FIG. 1 is a block diagram illustrating the structure of a mask pattern correcting apparatus according to a first embodiment. A mask pattern correcting apparatus 1A is a computer which creates a mask pattern for use in manufacturing a semiconductor device (semiconductor integrated circuit). The mask pattern correcting apparatus 1A creates mask pattern data with flare corrected, using layout pattern data (simply referred to as pattern).

At first, with respect to a layout pattern entered, the mask pattern correcting apparatus 1A of this embodiment obtains a correction amount (reference correction amount) for a reference flare value, through simulation of wafer transfer, in order to correct a fluctuation in a pattern dimension to be finished on a wafer, caused by the flare. It also obtains a change amount (hereinafter, referred to as flare correction sensitivity) of a correction amount corresponding to a change of a flare amount. Then, according to the flare correction sensitivity, it obtains a flare difference correction amount from a flare difference that is a difference between the flare value at a correction target pattern position and the reference flare value, and adds the above amount to the correction amount for the reference flare value, hence to correct a mask pattern.

At the same time, the mask pattern correcting apparatus 1A makes a table of reference correction amount and flare correction sensitivity so that it can be searched and referred. Therefore, when correcting the same pattern as the pattern registered in the table, the mask pattern correcting apparatus 1A can perform the mask pattern correction with the table without using the simulation of wafer transfer. Concretely, the mask pattern correcting apparatus 1A uses the flare difference that is the difference between the flare value of a pattern to be corrected and the reference flare value, the flare correction sensitivity registered in the table, and the reference correction amount (mask pattern correction amount with the reference flare value) registered in the table, hence to perform the pattern correction.

The mask pattern correcting apparatus 1A includes an input unit 51, an output unit 52, a search unit 5, a table creating unit 10, a pattern correcting unit 30, and a storing unit 20A. The input unit 51 receives various information necessary to create a mask pattern (flare correction) and makes the storing unit 20A store the information. The input unit 51 receives, for example, a design layout of a semiconductor device and flare values for every pattern position in the design layout. The flare value is a value varying depending on a position (coordinates within a shot) where a design pattern is arranged and in this embodiment, it is calculated in advance by an external device (such as flare value calculator).

The table creating unit 10 performs the processing (reference correction amount calculating unit 12) for calculating the optimal correction amount through the simulation of wafer transfer for the correction target pattern with the reference flare value and the processing (flare correction sensibility calculating unit 13) for obtaining the change of the optimal correction amount when the flare amount is changed (flare correction sensibility).

The reference correction amount calculating unit 12 performs the exposure simulation with the reference flare value on a new correction pattern (a pattern not registered in a table 70 described later) and calculates the optimal correction amount so that it may be finished in a desired dimension.

The simulation of wafer transfer with a predetermined flare value is the processing for obtaining an optical image with the predetermined flare value; for example, it can obtain an optical image (optical image with the flare modulated) with the flare taken into consideration, in the following formula (1).

$$Inew\ (x, y) = (1 - TIS) * I(x, y) + Flare\ (x, y) \quad (1)$$

Inew (x, y): light intensity after the flare is modulated at a position (x, y)
I(x, y): light intensity without considering flare at a position (x, y)
TIS: ratio of total scattered light
Flare (x, y): flare value at a position (x, y)

The reference flare value is set based on the flare value in the case of analyzing the flare distribution on the whole surface of a mask layout. The reference flare value may be, for example, an average flare value of the flare values on the whole surface of the mask layout, a flare value of high occupation ratio, a flare value positioned in the middle of the distribution, a flare value at a position where the exposure amount is adjusted, and a flare value at the exposure reference pattern position. The reference flare value may be set differently for each pattern type. The pattern type is defined by a pattern shape, a pattern dimension, and/or a pattern arrangement state.

The reference correction amount calculating unit 12 calculates the optimal mask pattern correction amount so that a difference (dimensional deviation amount) between the pattern shape on the wafer, in the case of using the flare modulated optical image for forming a pattern on the wafer, and a desired pattern shape on the wafer may be small. The mask pattern correction amount here is the mask pattern correction amount capable of forming a desired pattern on the wafer when the flare value at the current correction target pattern position is the same as the reference flare value. In other words, the mask pattern correction amount here is the mask pattern correction amount without considering the flare value at the current correction target pattern position. Therefore, the reference correction amount calculating unit 12 calculates a mask pattern correction amount (hereinafter, referred to as a reference correction amount) when the reference flare value is used for exposure.

The reference correction amount calculating unit 12 calculates a reference correction amount for every type of patterns. Therefore, when the pattern shape, dimension, and the neighboring pattern disposition information are different, it calculates a reference correction amount for every different pattern, regarding it as a different type of pattern. The patterns can be classified into some types according to the method of pattern matching or so.

The flare correction sensibility calculating unit 13 calculates a correction amount change corresponding to the flare change as flare correction sensibility. The flare correction sensibility illustrates a correspondence relation between a flare value and a mask pattern correction amount. The flare correction sensibility calculating unit 13 calculates a flare correction sensibility for a pattern processed by the reference correction amount calculating unit 12.

The flare correction sensibility, for example, is represented by a graph in which the horizontal axis shows the flare values and the vertical axis shows the mask pattern correction amounts. Similarly to the reference correction amount calculating unit 12, the flare correction sensibility calculating unit 13 calculates a flare correction sensibility for every type of patterns. The table creating unit 10 puts a pattern type into correspondence with a reference correction amount and a flare correction sensibility and registers them into the table 70.

The storing unit 20A is a memory for storing various kinds of information used for creating a mask pattern. The storing unit 20A includes a design layout storing unit 21, a flare value storing unit 22, and a table storing unit 23.

The design layout storing unit 21 stores each layout formed by a plurality of patterns and the flare value storing unit 22 stores the flare values at the positions where the patterns are arranged. The table storing unit 23 stores the table 70 created by the flare correction sensibility calculating unit 13.

The pattern correcting unit 30 calculates the optimal correction amount with reference to the table 70, corrects a pattern, and creates a mask pattern. It obtains the reference correction amount and the flare correction sensibility information from the table 70 and it performs the correction on the pattern considering the difference between the flare value at the pattern position and the reference flare value (formula (2)).

Correction Amount=Reference Correction Amount+
(Flare Correction Sensibility×ΔFlare)  (2)

Correction Amount: correction amount (correction amount with flare considered) of a pattern to be corrected
Reference Correction Amount: correction amount as for the reference flare value obtained from the table 70
Flare Correction Sensibility: correction change amount for the flare obtained from the table 70
ΔFlare: difference between the reference flare value and the flare value at a pattern position to be corrected The search unit 5 extracts a pattern to be corrected (correction target pattern) from the design layout storing unit 21 and determines whether the correction target pattern is a new pattern or existing pattern. The search unit 5 regards the same pattern as that registered in the table 70 as the existing pattern and the pattern not registered in the table 70 as the new pattern. The search unit 5 transmits the existing pattern to the pattern correcting unit 30. On the other hands, it transmits the new pattern to the table creating unit 10 once and after getting the reference correction amount and the flare correction sensibility, it transmits the new pattern to the pattern correcting unit 30. The output unit 52 supplies the mask pattern flare-corrected by the pattern correcting unit 30 to the external device.

Figure 2:
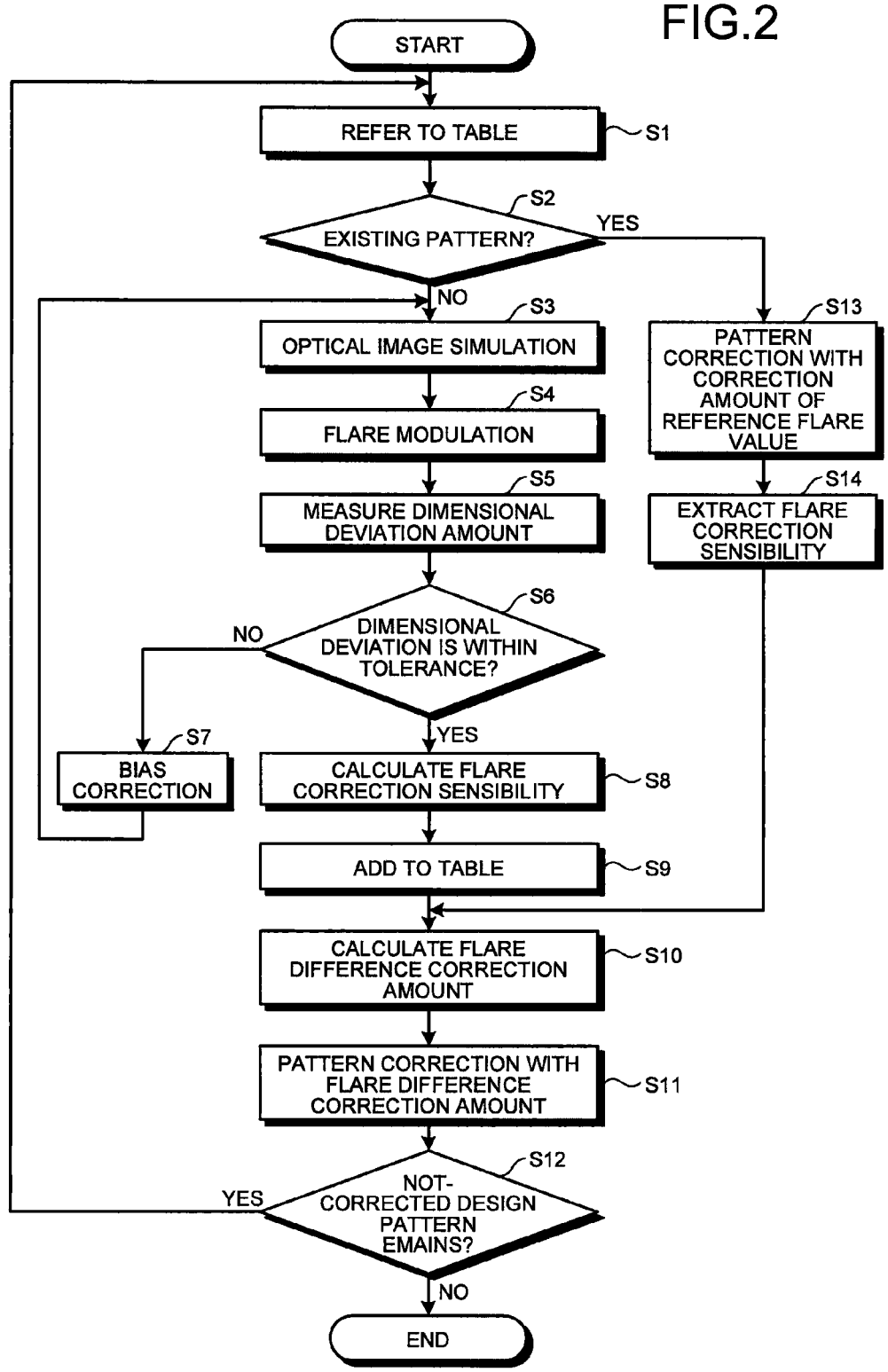
FIG. 2 is a flow chart illustrating the procedure of mask pattern correcting processing according to the first embodiment.

Next, the procedure of the mask pattern correcting processing will be described. FIG. 2 is a flow chart illustrating the procedure of the mask pattern correcting processing, according to the first embodiment. The storing unit 20A of the mask pattern correcting apparatus 1A stores the flare values for every layout and pattern in advance. Instead of the flare values for every pattern, it may store the flare value distribution within the layout.

The search unit 5 sequentially extracts the patterns targeted for creating a mask pattern from the layout within the design layout storing unit 21. The search unit 5 refers to the table 70 within the table storing unit 23 (Step S1) and checks whether the same pattern as the extracted pattern is registered in the table 70 or not. According to this, the search unit 5 checks whether the pattern is the existing pattern or not (Step S2).

Pattern extraction is performed in a way of cutting out a design pattern that is the correction target and its peripheral patterns including the above pattern which are all in the range of distance covered by the optical proximity effect (OPE: Optical Proximity Effect).

Here, to make the description easy, the processing for every pattern is explained for the sake of convenience; however, correction is generally performed for every pattern edge (side) or for every edge into which the pattern edge is further segmented. The correction values are managed by the unit of edge or by the unit of segmented edge, and an optimal correction amount and an optimal flare correction sensibility are calculated and corrected for every edge. In the pattern extraction, the relevant pattern and its peripheral patterns around the edge position are cut out and extracted.

When the extracted pattern is not the existing pattern (when it is a new pattern) (Step S2, No), the search unit 5 transmits the new pattern to the table creating unit 10. The reference correction amount calculating unit 12 performs the simulation of wafer transfer on the relevant pattern (Step S3). Therefore, an optical image to be formed on a wafer is derived.

The reference correction amount calculating unit 12 performs a conversion (flare modulation) of the optical image so that the optical image formed on the wafer may agree with the optical image in the case of exposure with the reference flare value (Step S4).

The reference correction amount calculating unit 12 measures a difference (dimensional deviation−amount) between the pattern formed on the wafer when a pattern is formed on a wafer with the flare modulated optical image and a desired pattern on the wafer (Step S5). Concretely, it calculates a deviation amount of a pattern dimension on the wafer from the desired dimension when the pattern is formed on the wafer with the intensity value (slice level) capable of resolving a pattern on the wafer.

The reference correction amount calculating unit 12 determines whether the dimensional deviation amount of the pattern dimension on the wafer obtained by the wafer transfer simulation from the desired dimension is in the tolerance or not (Step S6). When the dimensional deviation amount is out of the tolerance (Step S6, No), the reference correction amount calculating unit 12 performs a bias correction (mask pattern correction) on a pattern in a direction of decreasing order of the dimensional deviation amount (Step S7). Until the dimensional deviation amount becomes within the tolerance, the processing of Steps S3 to S7 is repeated.

The reference correction amount calculating unit 12 repeats the bias correction of the pattern and the simulation of the wafer transfer, thereby determining a mask pattern correction amount for a new pattern capable of forming a desired dimensional pattern on a wafer. The calculated mask pattern correction amount becomes the reference correction amount.

When the dimensional deviation amount is within the tolerance (Step S6, Yes), the flare correction sensibility calculating unit 13 calculates a flare correction sensibility based on the data used when calculating a reference correction amount by the reference correction amount calculating unit 12 (Step S8).

In the calculation of the flare correction sensibility, the flare correction sensibility calculating unit 13 calculates a dimensional change amount (ΔWaferCD/Δflare) of a pattern on a wafer at first when the flare is changed as for the optical image. The value (degree of the change) is referred to as flare CD sensibility. The flare correction sensibility calculating unit 13 calculates a dimensional change amount (ΔWaferCD/ΔMaskCD) of a pattern on a wafer in the case of bias correcting the pattern. This value (degree of the change) is referred to as MEF (Mask Enhance Factor). The flare correction sensibility calculating unit 13 uses these two values (relation) to calculate the flare correction sensibility in the following formula (3).

Flare Correction Sensibility=Flare CD sensibility/
MEF.  (3)

The flare correction sensibility calculating unit 13 may calculate the flare correction sensibility in another method. For example, the flare correction sensibility calculating unit 13 sets two or more flare values and performs the processing of Steps S3 to S7 for each flare value, hence to calculate an optimal mask pattern correction amount. The flare correction sensibility calculating unit 13 approximates the relation between the calculated mask pattern correction amount and the flare value in the formula.

Specifically, the flare correction sensibility calculating unit 13 sets the horizontal axis as the flare values and the vertical axis as the mask pattern correction amounts and plots the mask pattern correction amounts and the flare values. The flare correction sensibility calculating unit 13 derives a formula that fits the plotted relation. Using the derived formula as an approximate formula, the flare correction sensibility calculating unit 13 can calculate a flare correction amount as for the second pattern and the later (existing pattern) in a simple formula without the simulation of the wafer transfer.

After calculating the flare correction sensibility, the flare correction sensibility calculating unit 13 correlates the new pattern with the reference correction amount obtained in the above mentioned method and the flare correction sensibility and adds the correlated information to the table 70 within the table storing unit 23 (Step S9).

Hereinafter, a structure example of the table 70 will be described. FIG. 3 is a view illustrating the structure example of the table. In the table 70, new pattern (pattern shape, dimension, and peripheral pattern arrangement information), reference correction amount, and flare correction sensibility are correlated with each other.

The new pattern in the table 70 includes the pattern shape, the dimension, and the peripheral pattern arrangement information of a new pattern and a post-reference correction pattern has the pattern shape and dimension resulted from correcting the new pattern with the reference correction amount. The new pattern may be an actual pattern shape and dimension, or it may be a group of edge coordinates showing the pattern shape. The reference correction amount means a difference between the corrected pattern (hereinafter, referred to as the post-reference correction pattern) when the pattern is corrected with the reference correction amount and the new pattern.

A flare correction sensibility is information indicating a correspondence relation between a flare difference (deviation amount from the reference flare value) and a flare correction amount, which shows how much a flare correction amount is according to a deviation from the reference flare value.

A flare correction sensibility is a graph in which, for example, the horizontal axis shows the flare values and the vertical axis shows the flare correction amounts. In this case, for example, together with the property on the graph, the reference flare values and the reference correction amounts may be registered in the table. The flare correction sensibility may be an inclination of the above mentioned graph. The flare correction sensibility may be the property of two points on the above graph (relation between a flare value and a flare correction amount) and also may be the formula corresponding to the above graph.

After adding the information about a new pattern into the table 70, the pattern correcting unit 30 calculates a flare difference correction amount for the new pattern (Step S10), using the table 70 and the flare difference that is a difference between the flare value (flare value at the pattern position which is now being corrected) of the new pattern and the reference flare value. Concretely, the pattern correcting unit 30 calculates a flare difference correction amount based on a flare difference and a flare correction sensibility. The flare difference correction amount is a mask pattern correction amount considering the flare value at the pattern position now being corrected and a difference from the reference correction amount.

Concretely, the pattern correcting unit 30 calculates a flare difference correction amount in the following formula (4).

Flare Difference Correction Amount=(Flare Value at the Pattern Position−Reference Flare Value)× Flare Correction Sensibility (4)

After that, the pattern correcting unit 30 performs a mask pattern correction of a new pattern through adding the calculated flare difference correction amount to the reference correction amount (Step S11). The search unit 5 checks whether there remains any design pattern that is not subjected to the mask pattern correction (Step S12).

When there remains a not-corrected design pattern (Step S12, Yes), the mask pattern correcting apparatus 1A returns to the processing of Step S1. Referring to the table 70 (Step S1), the search unit 5 checks whether the pattern (correction target pattern) extracted from the layout is registered in the table 70 or not. According to this, the search unit 5 determines whether the design pattern is the existing pattern or not (Step S2).

When the extracted correction target pattern (the current correction target pattern) is a new pattern (Step S2, No), the mask pattern correcting apparatus 1A repeats the processing in Steps S3 to S12. On the other hand, when the extracted pattern is the existing pattern (Step S2, Yes), the pattern correcting unit 30 extracts the reference correction amount corresponding to the extracted pattern from the table 70. The pattern correcting unit 30 corrects the current correction target pattern with the reference correction amount according to the table 70 (Step S13). The corrected mask pattern becomes the mask pattern corrected with the reference flare value.

Further, the pattern correcting unit 30 extracts the flare correction sensibility corresponding to the extracted pattern from the table 70 (Step S14). The pattern correcting unit 30 calculates a difference between the flare value at the current correction target pattern position and the reference flare value as the flare difference. The pattern correcting unit 30 calculates a flare difference correction amount (difference from the reference correction amount) for the correction target pattern according to the flare difference and the flare correction sensibility (Step S10).

The pattern correcting unit 30 corrects the post-reference correction pattern with the calculated flare difference correction amount (Step S11). The search unit 5 checks whether there remains any design pattern that is not subjected to the mask pattern correction or not (Step S12).

When there remains a not-corrected design pattern (Step S12, Yes), the mask pattern correcting apparatus 1A repeats the processing in Steps S1 to S14. On the other hands, when there remains none of the non-corrected design pattern that is not subjected to the mask pattern correction (Step S12, No), the mask pattern correcting apparatus 1A finishes the mask pattern creating processing.

Figures 4A, 4B:
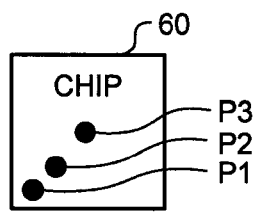
FIGS. 4A and 4B are views for use in describing a flare correction for each flare value.

FIG. 4 is a view for describing the flare correction for every flare value. As illustrated in FIG. 4A, flare value varies depending on the position in a chip (coordinates in the shot 60) where a design pattern (not-corrected pattern) is arranged. For example, the position P1 is the peripheral position in the shot 60 and the position P3 is the center position in the shot 60. The position P2 is the position between the position P1 and the position P3 in the shot 60.

As illustrated in FIG. 4B, even when not-corrected patterns 61 having the same shape and dimension are arranged respectively at the positions P1 to P3, the flare values are different at the positions P1 to P3. Here, it is shown that the flare value at the position P1 is low, the flare value at the position P3 is high, and that the flare value at the position P2 is in the middle of P1 and P3.

The respective not-corrected patterns 61 at the positions P1 to P3 have the respective optical images 62A to 62C corresponding to the respective flare values. When flare correction is performed on these not-corrected patterns 61 at the positions P1 to P3, the flares in the respective patterns, even when having the same shape and dimension, are corrected with different correction amounts. According to this flare correction, the not-corrected pattern 61 at the position P1 becomes the corrected pattern 63A thicker than the not-corrected pattern 61. The not-corrected pattern 61 at the position P2 becomes the corrected pattern 63B similarly to the non-corrected pattern 61 and the not-corrected pattern 61 at the position P3 becomes the corrected pattern 63C thinner than the not-corrected pattern 61. This correction amount is taken only by way of example; the actual correction amount changes according to the position of the pattern to be set as the reference of the exposure.

When the not-corrected patterns are the same, the original optical images with none of the flare taken into consideration are the same, even when the flare values are various. Therefore, it is useless to perform the same simulation of the wafer transfer on the same not-corrected patterns repeatedly. In this embodiment, the flare difference correction amount depending on the flare value is applied to each of the not-corrected patterns, thereby saving unnecessary simulation of wafer transfer.

As having been described in this embodiment, when flare correction sensibility is calculated in advance, the flare correction sensibility stored in the table 70 can be used for the mask pattern correction for the same not-corrected patterns succeeding. Since a flare difference correction amount depending on a flare value corresponding to the position of a pattern to be corrected is found by use of the flare correction sensibility, it is possible to perform the mask pattern correction with reference to the table 70. Therefore, the frequencies of simulation of wafer transfer can be much decreased.

For example, when a variation in the flare values on the chip is ±3% (range 6%), assuming that the step of the flare value is 0.3%, a variation in the flare values is 20 (6%÷0.3%). Therefore, the mask pattern correcting method according to this embodiment can reduce the frequency of the simulation from twenty times to once. It means that the mask pattern correction processing can be speeded up $20^{th}$ times faster.

According to this embodiment, since the mask pattern correction is performed by moving the pattern edge, it is possible to perform the mask pattern correction at a higher accuracy than in the case of the mask pattern correction performed in a way of reducing the flare fluctuation amount by arranging the dummy pattern.

According to this embodiment, since the mask pattern correction is performed by using the simulation of the wafer transfer and the flare correction sensibility, it is possible to perform the mask pattern correction at a higher accuracy than in the case of the mask pattern correction performed in the rule base (when correction is performed by a rule at high accuracy, the rule becomes complicated and not realistic).

The correction processing of a mask pattern is performed, for example, for every layer of the wafer process. A semiconductor device (semiconductor integrated circuit) is manufactured using a mask with the mask pattern corrected according to a necessity. Specifically, the mask is manufactured using the corrected mask pattern, exposure is performed on a wafer with a resist applied thereto, using the above mask, and then, the wafer is developed, to form the resist pattern on the wafer. The lower layer of the resist pattern is etched with the resist pattern used as the mask. According to this, the actual pattern corresponding to the resist pattern is formed on the wafer. In manufacturing the semiconductor device, the above mentioned mask pattern correction, exposure processing, development processing, and etching processing are repeated for every layer.

According to the first embodiment, as mentioned above, since the mask pattern correction is performed using the flare correction sensibility, it is not necessary to perform the simulation of the wafer transfer on the patterns having the same pattern arrangement but having various flare values. Therefore, one simulation of the wafer transfer of high processing load has only to be performed on the first new pattern, which enables the mask pattern correction of the existing patterns at high speed and at high accuracy. Accordingly, the mask pattern correction with flare taken into consideration can be performed at high speed and high accuracy.

(Second Embodiment)

Next, a second embodiment of the invention will be described with reference to FIGS. 5 to 8. Similarly to the first embodiment, the second embodiment is to perform a fast and accurate mask pattern correction on a correction target pattern having different flare values in the same pattern shape. In the second embodiment, mask pattern correction is performed in two steps of optical proximity effect correction and flare correction. In the step of the optical proximity effect correction, a mask pattern with two flare values corrected respectively is output. In the flare correction, a correction is performed considering the flare amounts at each pattern position in the mask pattern with the two flare values corrected.

Figure 5:
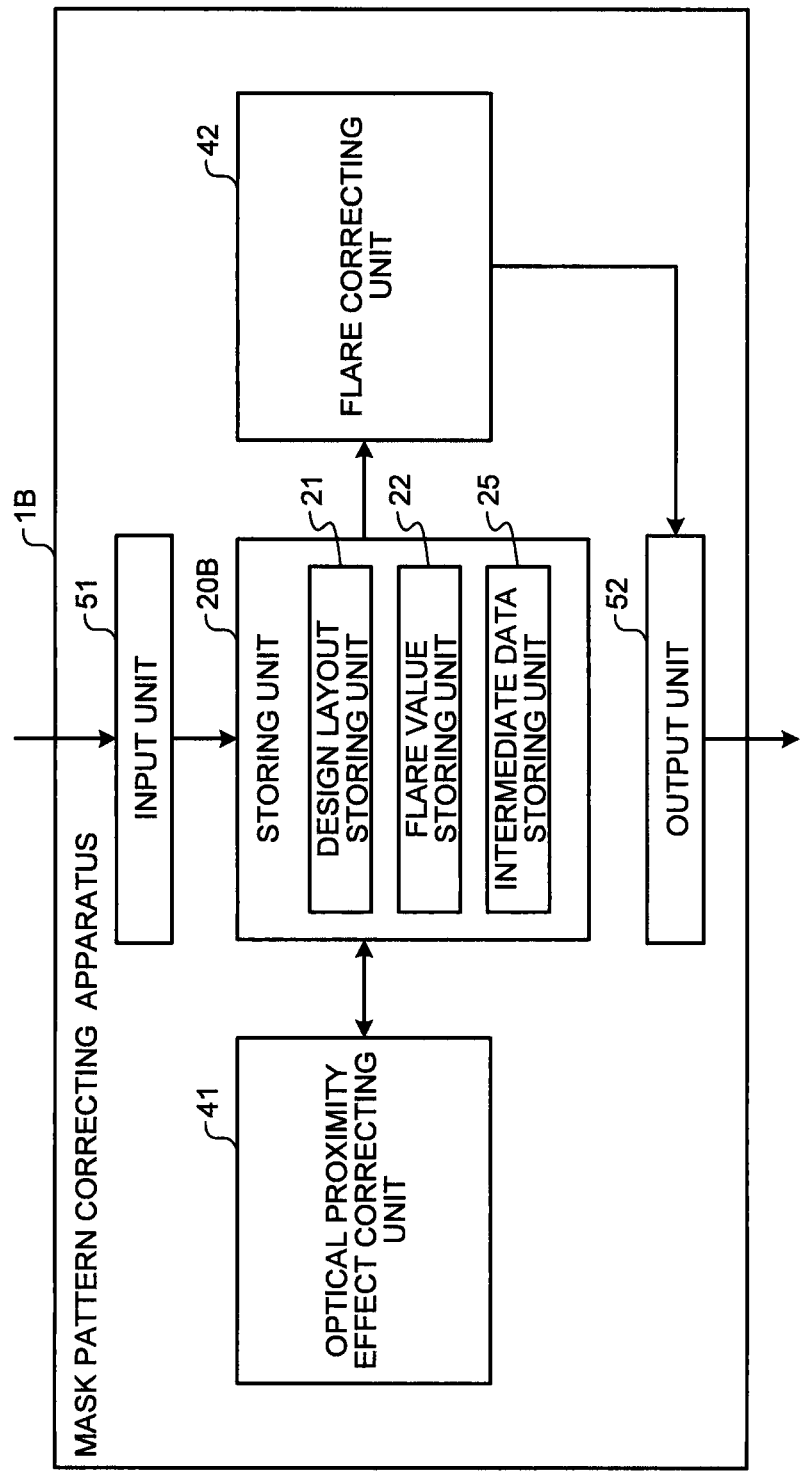
FIG. 5 is a block diagram illustrating the structure of a mask pattern correcting apparatus according to a second embodiment.

FIG. 5 is a block diagram illustrating the structure of a mask pattern correcting apparatus according to the second embodiment. The same reference numerals are attached to the components having the same functions as those of the mask pattern correcting apparatus 1A of the first embodiment illustrated in FIG. 1, hence the overlapping description will not be repeated.

A mask pattern correcting apparatus 1B includes an input unit 51, an output unit 52, an optical proximity effect correcting unit 41, a flare correcting unit 42, and a storing unit 20B. The storing unit 20B includes a design layout storing unit 21, a flare value storing unit 22, and an intermediate data storing unit 25.

The optical proximity effect correcting unit 41 performs an optical proximity effect correction (OPC: Optical Proximity Correction) on a layout with a constant flare value within the layout surface. The optical proximity effect correcting unit 41 performs a simulation of wafer transfer on the correction target pattern. The optical proximity effect correcting unit 41 calculates the optimal mask pattern correction amount so that a difference (dimensional deviation) between the finished pattern shape on a wafer obtained through the simulation and a desired pattern on the wafer may become small. The optical proximity effect correcting unit 41 of the embodiment obtains respective mask pattern correction amounts for at least two flare values (for example, a big flare value and a small flare value) with respect to the correction target pattern.

The optical proximity effect correcting unit 41 creates a mask pattern corrected with the two flare values (hereinafter, referred to as a post-OPC pattern), by correcting the correction target pattern with the respectively calculated mask pattern correction amounts. Here, the optical proximity effect correcting unit 41 may correct the mask pattern through the hierarchical processing described later.

The optical proximity effect correcting unit 41 transmits the data of the (two) post-OPC patterns created with the two flare values to the intermediate data storing unit 25 as the intermediate data. The optical proximity effect correcting unit 41 correlates the intermediate data with the two flare values used for generation of the intermediate data and transmits it to the intermediate data storing unit 25 as the intermediate data information. The intermediate data storing unit 25 stores the intermediate data information created by the optical proximity effect correcting unit 41.

The flare correcting unit 42 performs a flare correction on the correction target pattern, using the intermediate data (at least two post-OPC patterns), the two flare values, and the flare value at the position of the correction target pattern. The flare correcting unit 42 calculates a correction amount through interpolation (proximity) of the mask patterns, depending on the flare value at the position of the correction target pattern, using the two post-OPC patterns, and performs a correction. The output unit 52 outputs the mask pattern with the flare corrected by the flare correcting unit 42 to the external device.

Figure 6:
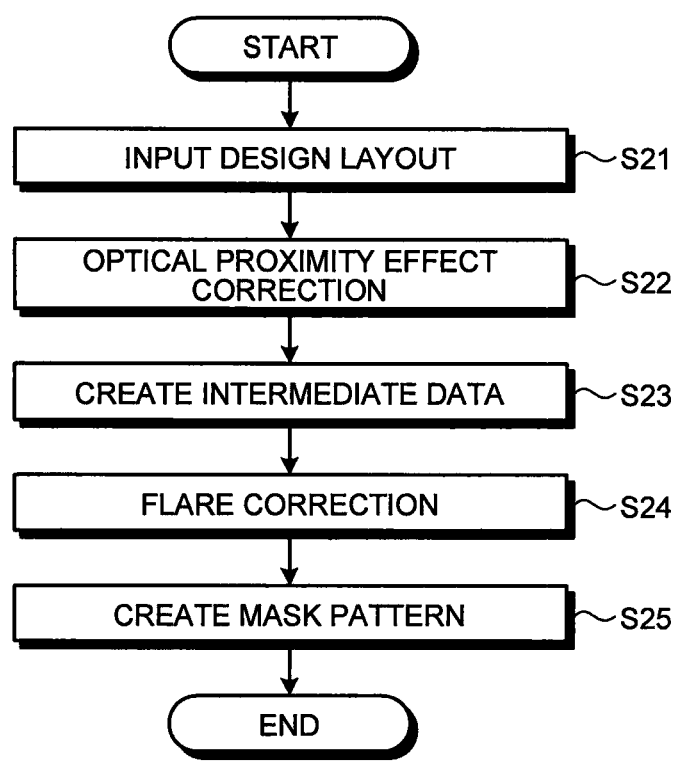
FIG. 6 is a flow chart illustrating the procedure of mask pattern correcting processing according to the second embodiment.

Next, the procedure of the mask pattern correcting processing will be described. FIG. 6 is a flow chart illustrating the procedure of the mask pattern correcting processing according to the second embodiment. The storing unit 20B of the mask pattern correcting apparatus 1B previously stores the layout and flare values for every pattern included in the layout. Here, instead of flare value for every pattern, the distribution data of flares within a chip may be stored.

The optical proximity effect correcting unit 41 receives a design layout (Step S21). The optical proximity effect correcting unit 41 performs an optical proximity effect correction on a pattern targeted for creating a mask pattern (correction target pattern) (Step S22). At that time, a predetermined flare fluctuation width ΔFlare is set as a parameter for a reference flare value (FB). The flare fluctuation width ΔFlare is set in the optical proximity effect correcting unit 41, for example, according to an instruction from a user of the mask pattern correcting apparatus 1B.

The optical proximity effect correcting unit 41 performs an optical proximity effect correction (OPC lower) in "FB−ΔFlare" that is the first flare value and an optical proximity effect correction (OPC higher) in "FB+ΔFlare" that is the second flare value, on all the correction target patterns included in design layout, for example, at the same time (first correction process). The post-OPC pattern created by the OPC lower and the post-OPC pattern created by the OPC higher become the intermediate data (Step S23).

The optical proximity effect correcting unit 41 outputs the correction result of the OPC lower and the OPC higher (two post-OPC patterns) to the intermediate data storing unit 25 as the intermediate data. The intermediate data may be controlled by using a database (data format inherent to OPC tool) within the optical proximity effect correction system, or it may be controlled by using the standard data format such as GDS (Graphic Database System) and OASIS (Organization for the Advancement of Structured Information Standards) (registered trademark).

Although this optical proximity effect correction adopts the scheme of the conventional optical proximity effect correction, it is different from the conventional one in that a correction amount is calculated while modulating the optical image (flare modulation) by the flare amount specified in the correction amount calculation. However, since the same flare value is used for the whole layout surface, an optical proximity effect correction with the range covered by the optical proximity effect (μm order) taken into consideration has only to be performed, thereby achieving a high speed optical proximity effect correction similarly to the conventional one. The optical proximity effect correcting unit 41 can also perform a high speed optical proximity effect correction, for example, using the hierarchical processing.

The flare correcting unit 42 reads out the intermediate data information from the intermediate data storing unit 25. The flare correcting unit 42 reads out the flare value (FB−ΔFlare and FB+ΔFlare) corresponding to each position of the correction target patterns from the flare value storing unit 22. The flare correcting unit 42 calculates a correction amount corresponding to the flare value of the correction target pattern through interpolation, according to the first post-OPC pattern created by the OPC lower and the second post-OPC pattern created by the OPC higher. The flare correcting unit 42 corrects the flare of the correction target pattern with the calculated mask pattern correction amount (second correction process) (Step S24). A mask pattern is created by performing the processing of Step S24 on the respective correction target patterns (Step S25).

Figure 7:
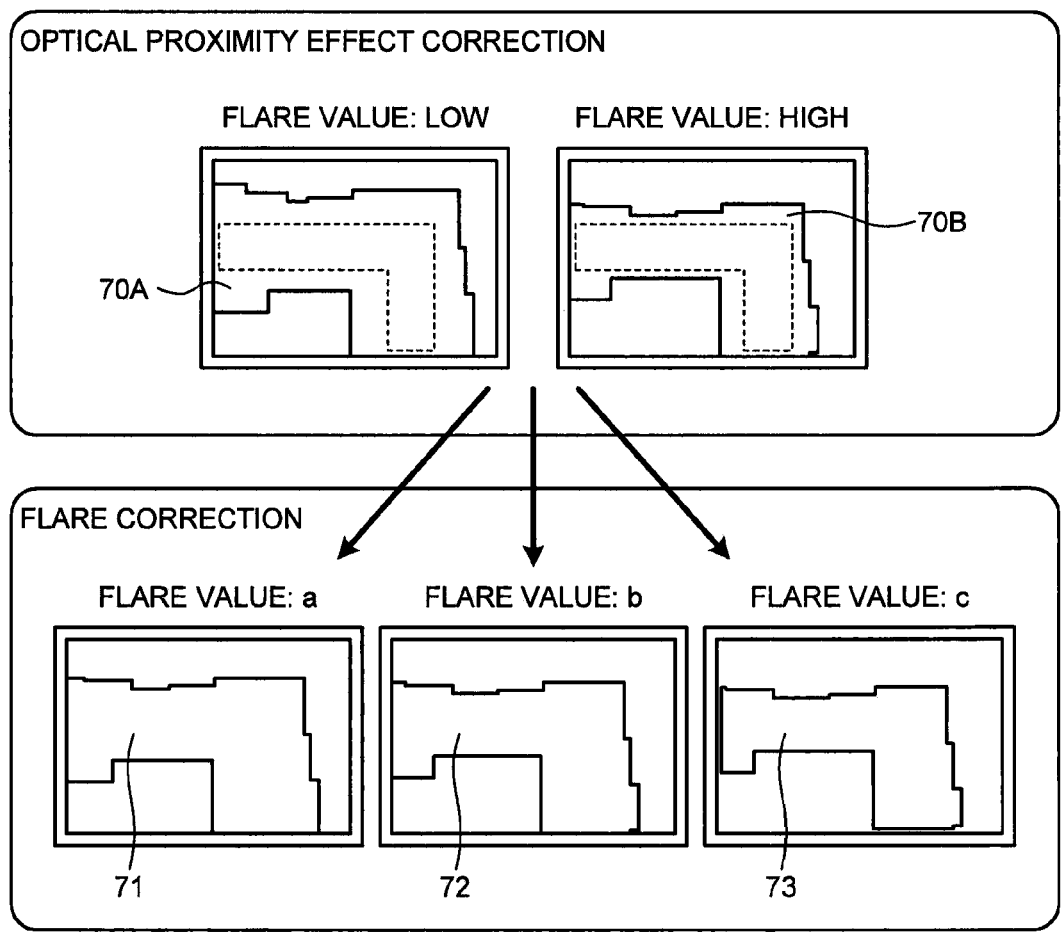
FIG. 7 is a view for use in describing the mask pattern correcting processing according to the second embodiment.

FIG. 7 is a view for use in describing the mask pattern correcting processing. In the first correcting process of the optical proximity effect correction, the optical proximity effect correcting unit 41 obtains a post-OPC pattern (corrected shape) 70A when the flare is low and a post-OPC pattern (corrected shape) 70B when the flare is high and outputs them as the intermediate data.

In the second correction process of the flare correction, the flare correcting unit 42 calculates a mask pattern correction amount for every correction target pattern (every flare value) through interpolation, according to the post-OPC patterns 70A and 70B included in the intermediate data. In short, a mask pattern correction amount for each flare value is calculated through the interpolation processing using a relation between the flare values used for calculating the post-OPC patterns 70A and 70B and the post-OPC patterns 70A and 70B. The flare correcting unit 42 corrects the respective correction target patterns using the calculated mask pattern correction amount.

Here, the case of creating a mask pattern 71 for a correction target pattern having the flare value of a is shown. Similarly, a mask pattern 72 is created for a correction target pattern having the flare value of b, and a mask pattern 73 is created for a correction target pattern having the flare value of c. The flare values a, b, and c are in a relation of a<b<c, and it is found that when the flare value is small, the corrected shape is large, when the flare value gets larger, the corrected shape is thinner, and that a correction depending on the flare amount is performed even in the same pattern.

By dividing the correction process into two as mentioned above, a high speed correction method in the conventional optical lithography can be applied in the first correction process. Further, in the second correction process, a mask pattern correction amount suitable for each position (each flare value) can be obtained through simple graphic processing (including the interpolation processing), from the mask pattern shapes (correction amounts) in two levels (two flare values). Accordingly, the mask pattern correction can be speeded up.

Although this embodiment calculates a post-OPC pattern with two levels of flare values, a fluctuation amount of flare correction for each flare value cannot always be expressed in a linear shape and in this case, three and more levels of flare values may be set in order to obtain an accurate correction amount.

Figure 8:
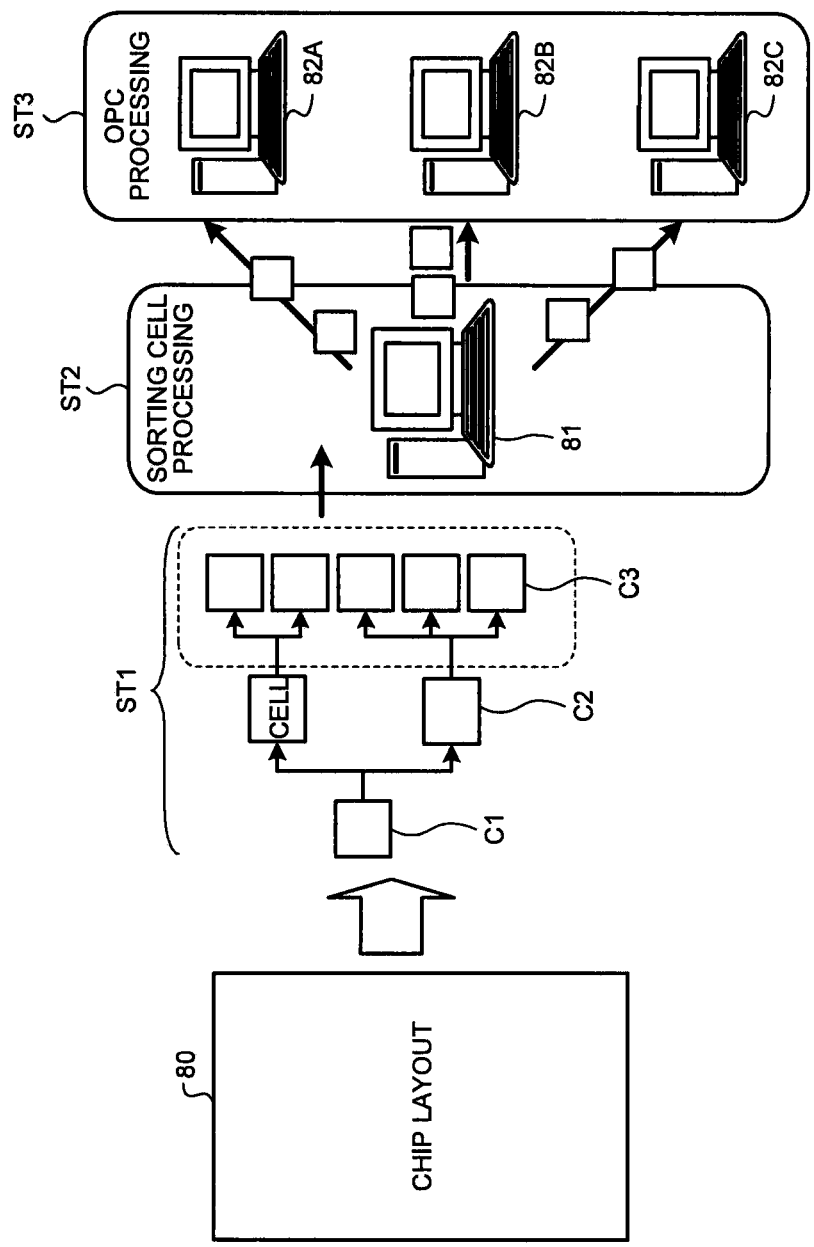
FIG. 8 is a view for use in describing an optical proximity effect correction using hierarchical processing.

Next, the optical proximity effect correction using the hierarchical processing will be described. FIG. 8 is a view for use in describing the optical proximity effect correction using the hierarchical processing. A plurality of cells (seed cells) C3 are set for a design layout of a chip (chip layout 80). The chip layout 80 is the data having the hierarchical structure including cells C1 to C3 data.

In this structure, a cell C1 is defined as a route cell and a plurality of cells C2 are set below. The common area having the same structure within the cell C1 is represented as one cell C2. Accordingly, a plurality of types of cells C2 is combined, hence to form the cell C1.

Similarly, a plurality of cells C3 forming the respective cells C2 are set. Here, the common area having the same structure within the cell C2 is represented as one cell C3. Therefore, several types of cells C3 are combined, hence to form the cell C2. Here, the cell C3 is the cell in the lowest layer.

After the chip layout 80 is represented in a plurality of layers, a device 81 determines which device (devices 82A to 82C) performs the optical proximity effect correction on which cell. In short, the device 81 sorts the cell processing (OPC processing) (ST2). The respective devices 82A to 82C perform the optical proximity effect correction (OPC processing) with each unit (ST3).

In this embodiment, the optical proximity effect correcting unit 41 may perform the optical proximity effect correction using the above-mentioned hierarchical processing, or the devices 81, 82A to 82C may perform the optical proximity effect correction using the hierarchical processing according to the instruction from the optical proximity effect correcting unit 41.

Although in this embodiment, the intermediate data is defined as a post-OPC pattern shape, the intermediate data may be defined as the mask pattern correction amount. In this case, the flare correcting unit 42 calculates the mask pattern correction amount depending on the flare value of the correction target pattern through interpolation. The calculated mask pattern correction amount is used to correct the flare of the post-OPC pattern.

As mentioned above, according to the second embodiment, the correction process is divided into two: in the first correction process, a high speed correction method in the conventional optical lithography can be used; and in the second correction process, a mask pattern correction amount suitable for each position (each flare value) can be obtained from the mask pattern shapes (correction amounts) in two levels (two flare values), through simple graphic processing (including interpolation processing). Accordingly, the mask pattern correction can be speeded up. Further, the mask pattern correction considering the flare can be performed at a high speed and at a high accuracy.

Further, in the first correction process, since the pattern position dependency (distribution of the flare values) of the correction target pattern does not have to be considered, the reference distance of the neighboring patterns is short similarly to the conventional OPC and the correction can be performed through the hierarchical processing for efficiently processing the data having the hierarchical structure such as GDS and OASIS. Therefore, the mask pattern correction can be performed at higher speed.

(Third Embodiment)

Next, a third embodiment of the invention will be described with reference to FIGS. 9 to 13. In the third embodiment, a mask pattern correction is performed in two steps of optical proximity effect correction and flare correction. In the step of the optical proximity effect correction, a correction with a reference flare amount is output. In the flare correction, a correction is performed with flare amount at each pattern position taken into consideration from the mask pattern corrected through the optical proximity effect based on the flare correction information corresponding to pattern types prepared in advance as a rule.

Figure 9:
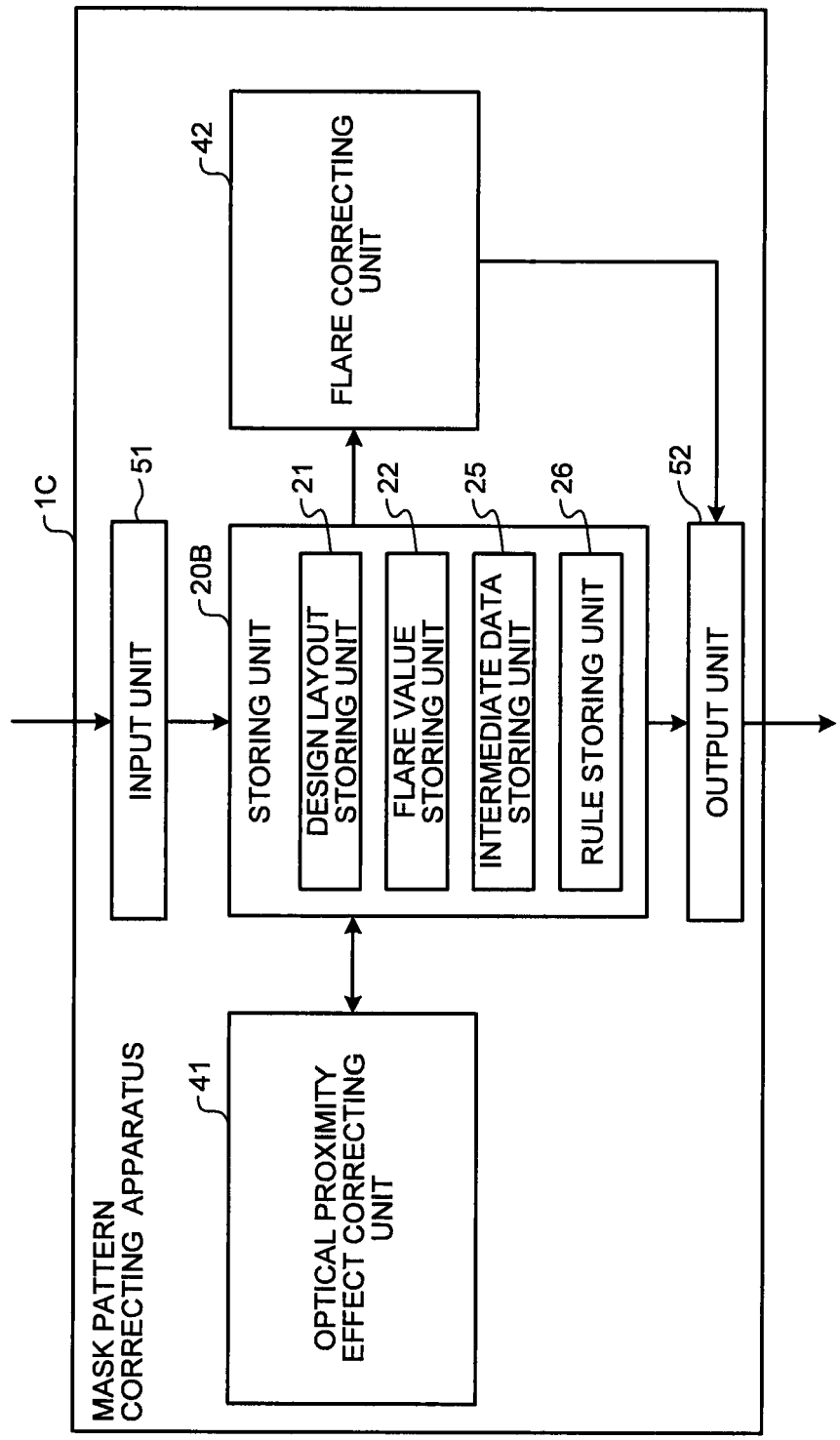
FIG. 9 is a block diagram illustrating the structure of a mask pattern correcting apparatus according to a third embodiment.

FIG. 9 is a block diagram illustrating the structure of a mask pattern correcting apparatus according to the third embodiment. Of the components illustrated in FIG. 9, the same reference numerals are attached to the components respectively having the same functions as those of the mask pattern correcting apparatus 1A according to the first embodiment illustrated in FIG. 1 and those of the mask pattern correcting apparatus 1B according to the second embodiment illustrated in FIG. 5, hence the overlapping description will not be repeated.

The mask pattern correcting apparatus 1C includes an input unit 51, an output unit 52, an optical proximity effect correcting unit 41, a flare correcting unit 42, and a storing unit 20B. The storing unit 20B includes a layout storing unit 21, a flare value storing unit 22, an intermediate data storing unit 25, and a rule storing unit 26.

The optical proximity effect correcting unit 41 performs an optical proximity effect correction (OPC: Optical Proximity Correction) on a layout with a reference flare value (with the same flare value on the whole layout surface). The optical proximity effect correcting unit 41 performs a simulation of wafer transfer on the correction target pattern with the reference flare value. The optical proximity effect correcting unit 41 calculates the optimal mask pattern correction amount so that a difference (dimensional deviation) between the finished pattern shape on a wafer obtained through the simulation and a desired pattern on the wafer may become small.

The optical proximity effect correcting unit 41 creates a mask pattern corrected through the optical proximity effect with the reference flare value (post-OPC pattern), by correcting the correction target pattern with the respectively calculated mask pattern correction amounts. Alternatively, the optical proximity effect correcting unit 41 may correct the mask pattern through the hierarchical processing having been described in the second embodiment.

The optical proximity effect correcting unit 41 transmits the data of the post-OPC pattern created with the reference flare value to the intermediate data storing unit 25 as the intermediate data. The optical proximity effect correcting unit 41 correlates the intermediate data with one flare value (reference flare value) used for generation of the intermediate data and transmits it to the intermediate data storing unit 25 as the intermediate data information. The intermediate data storing unit 25 stores the intermediate data information created by the optical proximity effect correcting unit 41.

The flare correcting unit 42 performs a flare correction on the intermediate data (post-OPC pattern with the reference flare value), using the correction rule information described later. The correction rule information is stored in the rule storing unit 26 in advance. The output unit 52 outputs the mask pattern with the flare corrected by the flare correcting unit 42 to the external device.

Figure 10:
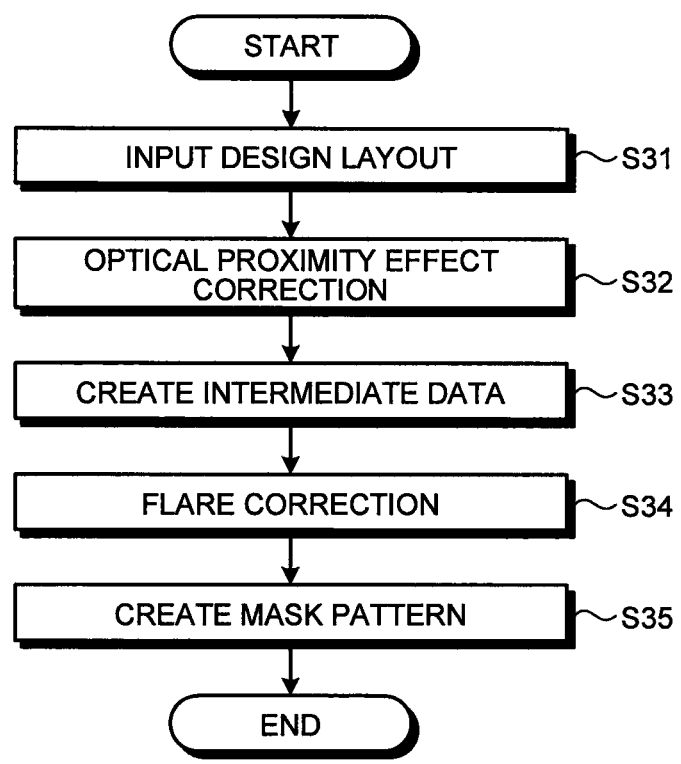
FIG. 10 is a flow chart illustrating the procedure of the mask pattern correcting processing according to the third embodiment.

Next, the procedure of the mask pattern correcting processing will be described. FIG. 10 is a flow chart illustrating the procedure of the mask pattern correcting processing according to the third embodiment. The storing unit 20B of the mask pattern correcting apparatus 1C previously stores the layout and the flare values for every pattern included in the layout. Here, instead of the flare value for every pattern, the distribution data of flares within a chip surface may be stored.

The optical proximity effect correcting unit 41 receives a layout (Step S31). The optical proximity effect correcting unit 41 performs an optical proximity effect correction on a pattern targeted for creating a mask pattern (correction target pattern) (Step S32). At that time, a reference flare value (FB) is determined.

The optical proximity effect correcting unit 41 performs a correction with the reference flare value (FB) on all the correction target patterns of the design layout. The correction here is performed only with the constant flare value (reference flare value) on the whole layout surface and not performed correspondingly to a change of the flare amount. Namely, only the affect from the optical proximity effect is corrected (OPC). The post-OPC pattern created here becomes the intermediate data (Step S33).

The optical proximity effect correcting unit 41 outputs the correction result of the OPC to the intermediate data storing unit 25 as the intermediate data information. The intermediate data may be controlled by using a database (data format inherent to OPC tool) within the optical proximity effect correction system, or it may be controlled by using the standard data format such as GDS (Graphic Database System) and OASIS (Organization for the Advancement of Structured Information Standards) (registered trademark).

Although this optical proximity effect correction adopts the scheme of the conventional optical proximity effect correction, it is different from the conventional one in that a correction amount is obtained while modulating the optical image (flare modulation) by the flare amount specified in the correction amount calculation. However, since the same flare value is used on the whole layout surface, an optical proximity effect correction with the range (μm order) covered by the optical proximity effect taken into consideration has only to be performed, thereby achieving a high speed optical proximity effect correction similarly to the conventional one. The optical proximity effect correcting unit 41 can also perform a high speed optical proximity effect correction, for example, using the hierarchical processing. On the other hand, when a correction with a change of the dose amount taken into consideration is not necessary, a correction using the optical image with the flare amount taken into consideration is not always performed in some cases.

The flare correcting unit 42 reads out the intermediate data information from the intermediate data storing unit 25 and at the same time, reads out the correction rule information from the rule storing unit 26. The correction rule information is the rule information with the pattern characteristics such as a line width of pattern (pattern width), and a distance between the adjacent patterns (pattern space) defined by flare correction sensibility, flare value, and correction amount, as illustrated in FIGS. 11A and 11B. According to the rule information, a pattern is corrected according to a rule corresponding to the pattern targeted for correction. For example, when the pattern width targeted for correction is 28 nm, the pattern space is 32 nm, the flare value at a correction target pattern position is 5%, and the reference flare value is 4%, a flare correction sensibility (−1.8 nm/%) corresponding to the pattern width 28 nm and the pattern space 32 nm is obtained according to the rule illustrated in FIG. 11A. Since the reference flare value is 4%, the difference is 1% (5% to 4%). Accordingly, the flare correction amount is −1.8 nm. The flare correcting unit 42 corrects the flare of the correction target pattern with the above mentioned calculated flare correction amount (second correction process) (Step S34). A mask pattern is created by performing the processing of Step S34 on the respective correction target patterns (Step S35).

Figure 12A:
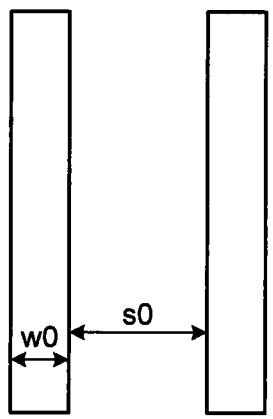
FIGS. 12A to 12C are views for use in describing a definition example of the correction rule.
Figure 12B:
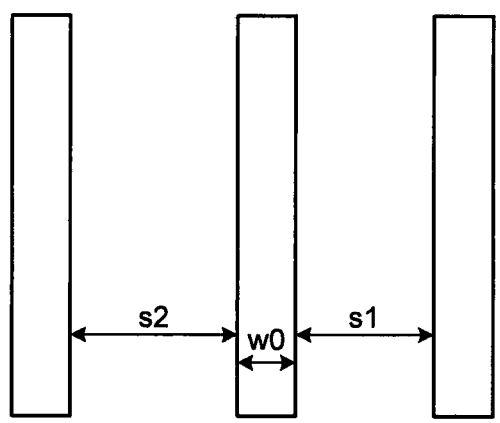
Figure 12C:
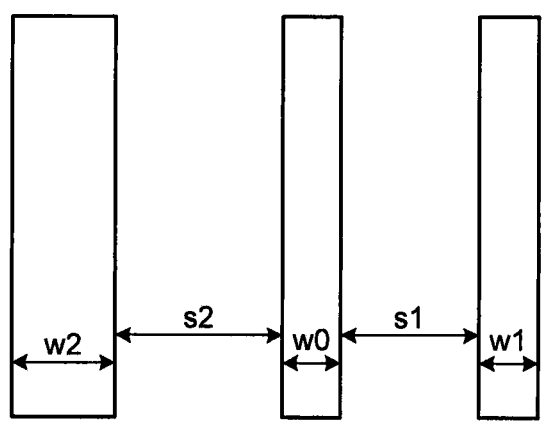

Further, the correction rule may be defined by not only the pattern width w0 of the correction target pattern and the pattern space s0, as illustrated in FIG. 12A, but also a plurality of pattern spaces (s1, s2) and a plurality of pattern widths (w0 to w2), as illustrated in FIGS. 12b and 12C. As far as it is a parameter capable of defining the characteristics of the patterns, whatever rule will do.

In this embodiment, although with the flare correction sensibility correlated with the characteristics of a pattern, it is converted into a correction amount at a correction time, the flare correction amount can be directly correlated by adding the flare amount to the pattern characteristics, using the rule information as illustrated in FIG. 11B. The flare correction sensibility and the flare amount described in the correction rule may be calculated in advance using the optical exposure simulation, or using the value obtained from the experiment. Further, the flare correction sensibility and the correction amount correlated with the rule is not calculated in advance through the optical exposure simulation but a rule may be created while calculating the above values at real time at a correction time depending on necessity.

In the flare correction of the second correction process, the flare correcting unit 42 calculates a mask pattern flare correction amount for every correction target pattern, based on the post-OPC pattern of the intermediate data and the rule. The flare correcting unit 42 corrects each correction target pattern using the calculated mask pattern correction amount.

By dividing the correction process into two as mentioned above, a high speed correction method in the conventional optical lithography can be applied in the first correction process. Further, in the second correction process, a simple correction is possible because a flare correction is performed not using the optical exposure simulation but using a rule. Accordingly, the mask pattern correction can be speeded up.

In this embodiment, the optical proximity effect correcting unit 41 may perform the optical proximity effect correction using the hierarchical processing, or the devices 81 and 82A to 82C may perform the optical proximity effect correction using the hierarchical processing according to the instruction from the optical proximity effect correcting unit 41.

Next, the hardware structure of the mask pattern correcting apparatus 1A, 1B, and 1C will be described. The mask pattern correcting apparatus 1A, 1B, and 1C have the same hardware structure; therefore, the hardware structure of the mask pattern correcting apparatus 1A will be described hereinafter.

Figure 13:
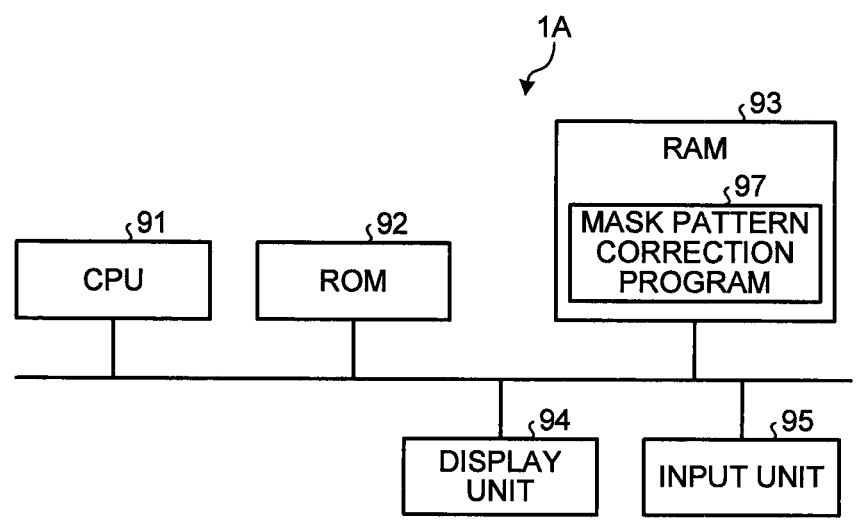
FIG. 13 is a view illustrating the hardware structure of the mask pattern correcting apparatus.

FIG. 13 is a view illustrating the hardware structure of the mask pattern correcting apparatus. The mask pattern correcting apparatus 1A includes a CPU (Central Processing Unit) 91, a ROM (Read Only Memory) 92, a RAM (Random Access Memory) 93, a display unit 94, and an input unit 95. In the mask pattern correcting apparatus 1A, the CPU 91, ROM 92, RAM 93, display unit 94, and input unit 95 are connected together through a bus line.

The CPU 91 checks a pattern using a mask pattern correction program 97 that is a computer program. The display unit 94 is a display such as a liquid crystal monitor, which displays the design patterns, the flare values, the table 70, and the mask patterns (correction result), according to the instruction from the CPU 91. The input unit 95 includes a mouse and a keyboard, which receives instruction information (parameter and the like necessary for the mask pattern correction) externally entered from a user. The instruction information entered in the input unit 95 is transmitted to the CPU 91.

The mask pattern correction program 97 is stored in the ROM 92 and loaded into the RAM 93 through the bus line. FIG. 13 illustrates the state with the mask pattern correction program 97 loaded into the RAM 93.

The CPU 91 executes the mask pattern correction program 97 loaded into the RAM 93. Specifically, in the mask pattern correcting apparatus 1A, the CPU 91 reads out the mask pattern correction program 97 from the ROM 92 and extends it in the program storing region within the RAM 93 to execute various processing, according to a user's instruction entered from the input unit 95. The CPU 91 temporarily stores various data generated in the various processing in the data storing region formed within the RAM 93.

The mask pattern correction program 97 executed by the mask pattern correcting apparatus 1A is formed as a module including a search unit 5, a table creating unit 10, and a pattern correcting unit 30, which is loaded in a main memory, and these functions are created on the main memory.

The mask pattern correction program 97 may be formed by a plurality of programs. For example, the mask pattern correction program 97 may include three programs: a program corresponding to the search unit 5, a program corresponding to the table creating unit 10, and a program corresponding to the pattern correcting unit 30.

The mask pattern correction program 97 executed by the mask pattern correcting apparatus 1B and 1C is formed as a module including the optical proximity effect correcting unit 41 and the flare correcting unit 42. Also in this case, the mask pattern correction program 97 may include two programs: a program corresponding to the optical proximity effect correcting unit 41 and a program corresponding to the flare correcting unit 42. Further, instead of the ROM, an external storage (HDD and the like) may be used or any other connection than the bus line such as LAN may be used.

Although in this embodiment, the intermediate data is defined as a post-OPC pattern shape, the intermediate data may be defined as the mask pattern correction amount. In this case, the flare correcting unit 42 calculates the mask pattern correction amount depending on the flare value of the correction target pattern through interpolation. The calculated mask pattern correction amount is used to correct the flare of the post-OPC pattern.

According to the third embodiment, the correction process is divided into two: in the first correction process, a high speed correction method in the conventional optical lithography can be used; and in the second correction process, with the flare sensibility or flare correction amount defined as a rule with simple pattern characteristic amount, a correction is performed using the rule, hence to obtain the flare in simple correction processing. Accordingly, the mask pattern correction can be speeded up. Further, the mask pattern correction considering the flare can be performed at high speed and at high accuracy.

Further, in the first correction process, since the pattern position dependency (distribution of the flare values) of the correction target pattern does not have to be considered, the reference distance of the neighboring patterns is short similarly to the conventional OPC and the correction can be performed through the hierarchical processing for efficiently processing the data having the hierarchical structure such as GDS and OASIS. Therefore, the mask pattern correction can be performed at higher speed.

As mentioned above, according to the first to third embodiments, it is possible to perform a mask pattern correction with flare taken into consideration at high speed and high accuracy.

As another method, the first process may be saved and when performing a correction using the correction rule in the second process, the optical proximity effect correction information and the flare correction information are described in the correction rule, hence to enable the simultaneous correction of the optical proximity effect and the flare.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of correcting a mask pattern comprising:
   calculating, as a reference mask correction amount, a mask pattern correction amount at a reference flare value through a simulation of wafer transfer, for each of a plurality of types of patterns included in a layout;
   calculating, as change amount information, a change amount of the mask pattern correction amount corresponding to a change amount of a flare value for each of the plurality of types of patterns;
   creating correspondence information correlating the patterns, the reference mask correction amounts, and the change amount information;
   extracting, from the correspondence information, the reference mask correction amount and the change amount information corresponding to a target pattern;
   calculating, as a difference correction amount, a difference between the mask pattern correction amount corresponding to a flare value at an arrangement position where the target pattern is arranged and the reference mask correction amount, based on:
      a flare difference that is a difference between the flare value at the arrangement position and the reference flare value,
      the extracted reference mask correction amount, and
      the extracted change amount information; and
   creating a mask pattern corresponding to the target pattern, using the difference correction amount and the reference mask correction amount.

2. The method according to claim 1, wherein the change amount information is calculated based on a finished dimension change amount of a pattern on a substrate corresponding to the change amount of the flare value and a finished dimension change amount of the pattern on the substrate corresponding to the change amount of the mask pattern correction amount.

3. The method according to claim 1, wherein the change amount information is information obtained by approximating a relation between a plurality of flare values and a mask pattern correction amount calculated for the flare values, in a formula.

4. The method according to claim 1, wherein the reference flare value is set based on the flare values in the case of analyzing a flare distribution on a whole surface of a mask layout.

5. The method according to claim 1, wherein the reference flare value is an average flare value of the flare values on a whole surface of a mask layout, a flare value of high occupation ratio, a flare value positioned in a middle of the distribution, a flare value at a position where exposure amount is adjusted, or a flare value at an exposure reference pattern position.

6. The method according to claim 1, wherein the reference flare value is set differently for each type of the patterns.

7. A method of correcting a mask pattern, comprising:
   performing optical proximity effect corrections on a pattern within a layout with two reference flare values, respectively;
   calculating first mask patterns for the reference flare values;
   calculating a mask pattern correction amount for the pattern, based on:

a flare value at an arrangement position where the pattern is arranged, and the first mask patterns; and obtaining a second mask pattern corresponding to the flare value at the arrangement position, based on the mask pattern correction amount.

8. The method according to claim 7, wherein with respect to the flare value at the arrangement position, the second mask pattern is calculated, by performing interpolation processing using a relation between a plurality of flare values and the mask pattern correction amounts for a plurality of flare values of the first mask patterns.

9. The method according to claim 7, wherein the first mask patterns are calculated by hierarchical data processing.

10. A method of correcting a mask pattern comprising:

creating a correction rule correlating a change amount of a mask pattern correction amount with a change amount of a flare value and pattern characteristics of a mask pattern, the pattern characteristics including at least one of a line width of the mask pattern or a distance from an adjacent pattern to the mask pattern; and performing a flare correction for a target mask pattern based on the correction rule, pattern characteristics of the target mask pattern, and a flare value at a position where the target mask pattern is located.

11. A computer program product having a computer-readable recording medium including a plurality of instructions, which, when executed by a computer, cause the computer to:

calculate, as a reference mask correction amount, a mask pattern correction amount at a reference flare value through a simulation of wafer transfer, for each of a plurality of types of patterns included in a layout;

calculate, as change amount information, a change amount of the mask pattern correction amount corresponding to a change amount of a flare value for each of the plurality of types of patterns;

create correspondence information correlating the patterns, the reference mask correction amounts, and the change amount information;

extract, from the correspondence information, the reference mask correction amount and the change amount information corresponding to a target pattern;

calculate, as a difference correction amount, a difference between the mask pattern correction amount corresponding to a flare value at an arrangement position where the target pattern is arranged and the reference mask correction amount, based on:

a flare difference that is a difference between the flare value at the arrangement position and the reference flare value, the extracted reference mask correction amount, and the extracted change amount information; and create a mask pattern corresponding to the target pattern, using the difference correction amount and the reference mask correction amount.

12. A computer program product having a computer-readable recording medium including a plurality of instructions, which, when executed by a computer, cause the computer to:

create a correction rule correlating a change amount of a mask pattern correction amount with a change amount of a flare value and pattern characteristics of a mask pattern, the pattern characteristics including at least one of a line width of the mask pattern or a distance from an adjacent pattern to the mask pattern; and perform a flare correction for a target mask pattern based on the correction rule, pattern characteristics of the target mask pattern, and a flare value at a position where the target mask pattern is located.

13. A method of manufacturing a semiconductor device comprising:

calculating, as a reference mask correction amount, a mask pattern correction amount at a reference flare value through a simulation of wafer transfer, for each of a plurality of types of patterns included in a layout;

calculating, as change amount information, a change amount of the mask pattern correction amount corresponding to a change amount of a flare value for each of the plurality of types of patterns;

creating correspondence information correlating the patterns, the reference mask correction amounts, and the change amount information;

extracting, from the correspondence information, the reference mask correction amount and the change amount information corresponding to a target pattern;

calculating, as a difference correction amount, a difference between the mask pattern correction amount corresponding to a flare value at an arrangement position where the target pattern is arranged and the reference mask correction amount, based based on:

a flare difference that is a difference between the flare value at the arrangement position and the reference flare value, the extracted reference mask correction amount, and the extracted change amount information;

creating a mask pattern corresponding to the target pattern, using the difference correction amount and the reference mask correction amount;

manufacturing a mask using the created mask pattern; and forming a pattern on a substrate using the manufactured mask.

14. A method of manufacturing a semiconductor device, comprising:

creating a correction rule correlating a change amount of a mask pattern correction amount with a change amount of a flare value and pattern characteristics of a mask pattern, the pattern characteristics including at least one of a line width of the mask pattern or a distance from an adjacent pattern to the mask pattern; and creating a mask pattern by performing a flare correction for a target mask pattern based on the correction rule, pattern characteristics of the target mask pattern, and a flare value at a position where the target mask pattern is located;

manufacturing a mask using the created mask pattern; and manufacturing a pattern on a substrate using the manufactured mask.

* * * * *